US010354979B1

(12) United States Patent
Faoro

(10) Patent No.: US 10,354,979 B1
(45) Date of Patent: Jul. 16, 2019

(54) MICROCIRCUIT CARD ASSEMBLY INCLUDING DUAL-SIDED COOLING PATHS

(71) Applicant: RAYTHEON COMPANY, Waltham, MA (US)

(72) Inventor: James E. Faoro, Tucson, AZ (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/894,384

(22) Filed: Feb. 12, 2018

(51) Int. Cl.
*H01L 25/00* (2006.01)
*H01L 25/065* (2006.01)
*H01L 23/538* (2006.01)
*H01L 23/367* (2006.01)

(52) U.S. Cl.
CPC ...... *H01L 25/0657* (2013.01); *H01L 23/3675* (2013.01); *H01L 23/5389* (2013.01); *H01L 25/50* (2013.01); *H01L 2225/06589* (2013.01)

(58) Field of Classification Search
CPC ............ H01L 25/0657; H01L 23/3675; H01L 23/5389; H01L 2225/06589; H01L 25/50
See application file for complete search history.

(56) References Cited

U.S. PATENT DOCUMENTS

| | | | |
|---|---|---|---|
| 5,719,069 A | * | 2/1998 | Sparks .............. B81C 1/00246 148/DIG. 135 |
| 6,297,960 B1 | | 10/2001 | Moden et al. |
| 6,700,783 B1 | | 3/2004 | Liu et al. |
| 8,928,115 B2 | | 1/2015 | Hauenstein |
| 2008/0042261 A1 | | 2/2008 | Wolter et al. |
| 2009/0154111 A1 | | 6/2009 | Lynch |
| 2010/0097767 A1 | | 4/2010 | Jude et al. |
| 2012/0001314 A1 | | 1/2012 | Schuetz |
| 2012/0168936 A1 | | 7/2012 | Huang et al. |
| 2014/0048923 A1 | | 2/2014 | Hauenstein |
| 2015/0035120 A1 | | 2/2015 | Hauenstein |
| 2015/0098176 A1 | | 4/2015 | Dean et al. |
| 2016/0120019 A1 | | 4/2016 | Shed |
| 2017/0105313 A1 | | 4/2017 | Shed |

OTHER PUBLICATIONS

International Search Report and Written Opinion for International Application No. PCT/US2019/017221; Application filed Feb. 8, 2019; dated May 20, 2019 (15 pages).

* cited by examiner

*Primary Examiner* — Elias Ullah
(74) *Attorney, Agent, or Firm* — Cantor Colburn LLP

(57) ABSTRACT

A three-dimensional (3D) circuit card assembly includes a substrate package and a passive heat transfer unit. The substrate package includes a plurality of individual substrates stacked atop one another. The passive heat transfer unit includes at least one intermediate heat dissipation plate configured to receive heat from the substrate package, and a thermally conductive dissipation cover configured to dissipate the heat received from the at least one intermediate heat dissipation plate away from the 3D circuit card assembly.

17 Claims, 6 Drawing Sheets

_US 10,354,979 B1_

MICROCIRCUIT CARD ASSEMBLY INCLUDING DUAL-SIDED COOLING PATHS

BACKGROUND

The subject matter disclosed herein relates to circuit card assemblies, and more particularly, to three-dimensional microcircuit card assemblies including passive thermal transfer interfaces.

The demand for reduced chip packaging has led to increased functional convergence as well as increased packaging complexity and sophistication. These demands have led to a shift in chip packaging technology from two-dimensional (2D) packaging to more advanced "two and a half dimensional" or pseudo three-dimensional (2.5D), and three-dimensional (3D) package designs.

Traditional 2D packaging involves chip design layouts that are arranged across a single plane, typically referred to as the horizontal plane, or along the length and width of a substrate. Traditional 2.5D designs were developed to incorporate multiple chips in a single package by arranging the chips in a planar fashion around an interposer. The interposer gradually could then be replaced by through-silicon vias as chips are thinned out and bonded together. The 3D packaging approach is typically viewed as arranging chips not only along the horizontal plane (i.e., the length of width of a substrate), but also along the vertical plane (e.g., height) by stacking chips atop one another. This stacked arrangement provided by 3D packaging requires improved thermal management, which is typically addressed using active heating devices such as fans or fluid-based heat exchangers.

BRIEF DESCRIPTION

Disclosed herein is a three-dimensional (3D) circuit card assembly that includes a substrate package and a passive heat transfer unit. The substrate package includes a plurality of individual substrates stacked atop one another. The passive heat transfer unit includes at least one intermediate heat dissipation plate configured to receive heat from the substrate package, and a thermally conductive dissipation cover configured to dissipate the heat received from the at least one intermediate heat dissipation plate away from the 3D circuit card assembly.

Also disclosed is a method of dissipating heat from a three-dimensional (3D) circuit card assembly. The method comprises interposing at least one intermediate heat dissipation plate between first and second substrate, and encasing the first substrate, the intermediate dissipation plate, and the second substrate in a thermally conductive dissipation cover such that opposing cover sidewalls of the dissipation cover are in thermal communication with opposing plate sidewalls of the intermediate dissipation plate. The method further includes transferring heat from the first and second substrates to a base of the intermediate dissipation plate, and transferring the heat from the base to the opposing plate sidewalls. The method further comprises transferring the heat from the opposing plate sidewalls to the opposing cover sidewalls, and dissipating the heat received from the opposing plate sidewalls away from the 3D circuit card assembly via the opposing cover sidewalls and an upper surface of the thermally conductive dissipation cover.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed system, apparatus and method are presented herein by way of exemplification and not limitation with reference to the Figures.

The stacked arrangement of traditional 3D circuit card assemblies reduces heat path locations capable of dissipating heat from central areas of the assembly, thereby reducing the overall heat dissipation of the assembly. Traditional solutions to improve heat dissipation in 3D circuit card assemblies have focused on incorporating active heat transfer techniques such as electrically powered fans and electrical pumps coupled with fluid-based heat exchanges. These active heat transfer systems, however, increase overall packaging size and monetary costs, while also requiring added power sources to drive the active heat transfer system.

Various non-limiting embodiments described herein provide a 3D microcircuit card assembly that includes dual-sided passive cooling paths. The 3D microcircuit card assembly includes an alternating stack of circuit substrates and one or more intermediate heat dissipation plates. The stacked arrangement is then encased in a thermally conductive dissipation cover. Opposing sidewalls of the dissipation cover are configured to dissipate heat delivered thereto into the surrounding atmosphere and away from the assembly.

Each intermediate heat dissipation plate included in the 3D microcircuit card assembly includes sides that are in thermal communication with the dissipation cover. The intermediate heat dissipation plate receives heat from the alternating stack of circuit substrates, and delivers the heat to the sidewalls of the dissipation cover. In at least one embodiment, the intermediate heat dissipation plate pulls heat away from the central area of the 3D microcircuit card assembly, and spreads the heat to the intermediate heat dissipation plate sidewalls. The path from the intermediate heat dissipation plate to a sidewall of the dissipation cover defines an individual passive cooling path. In this manner, the dual-sided passive cooling paths effectively transfer heat from the intermediate heat dissipation plate and various heat dissipating components in contact with the intermediate heat dissipation plates, and to the heat to the sidewalls and upper surface of the dissipation cover where it is dissipated into the surrounding air and away from the assembly.

Figure 1:
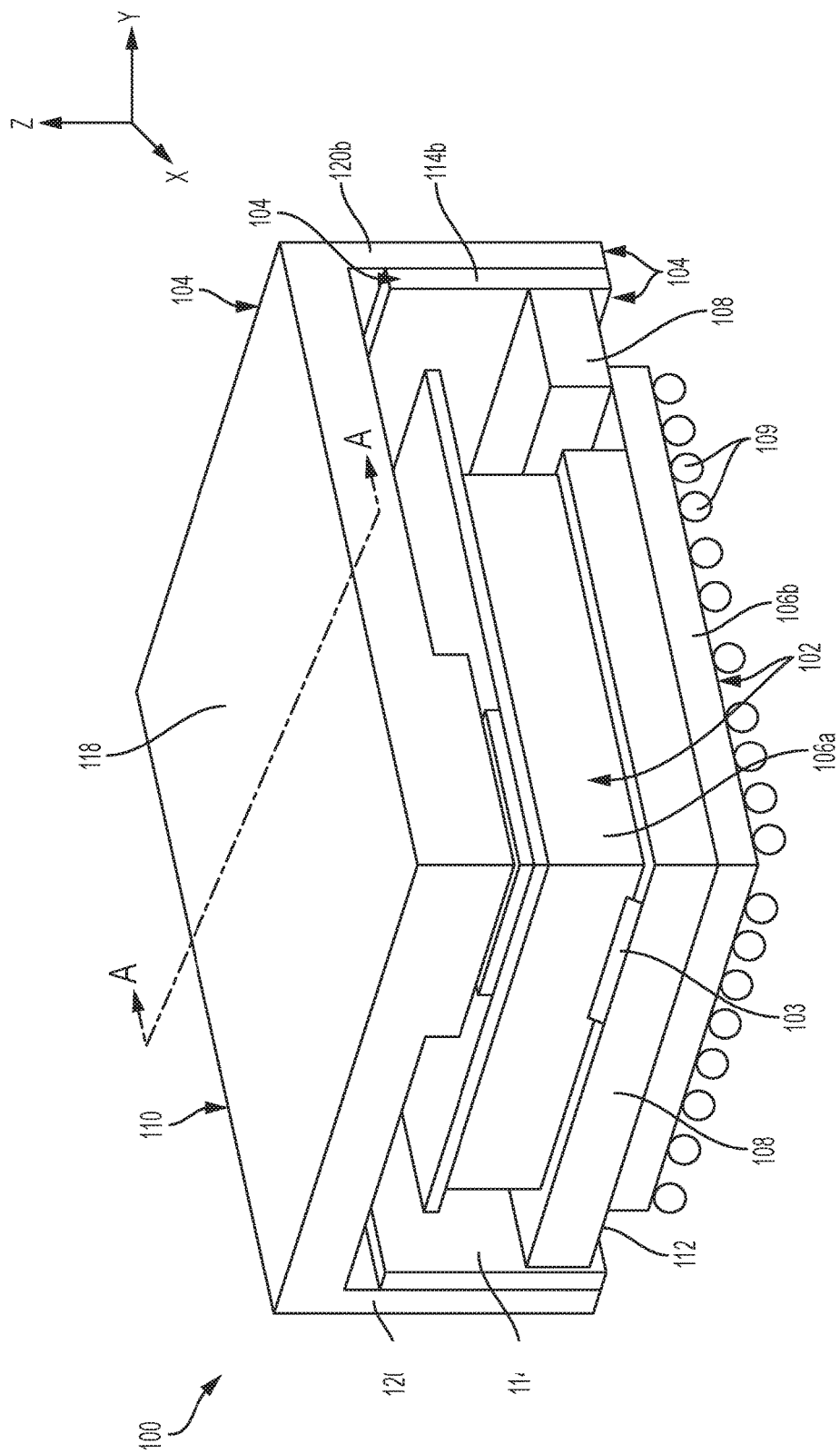
FIG. 1 is a perspective view of a 3D microcircuit card assembly including dual-sided passive cooling paths according to a non-limiting embodiment.
Figure 2:
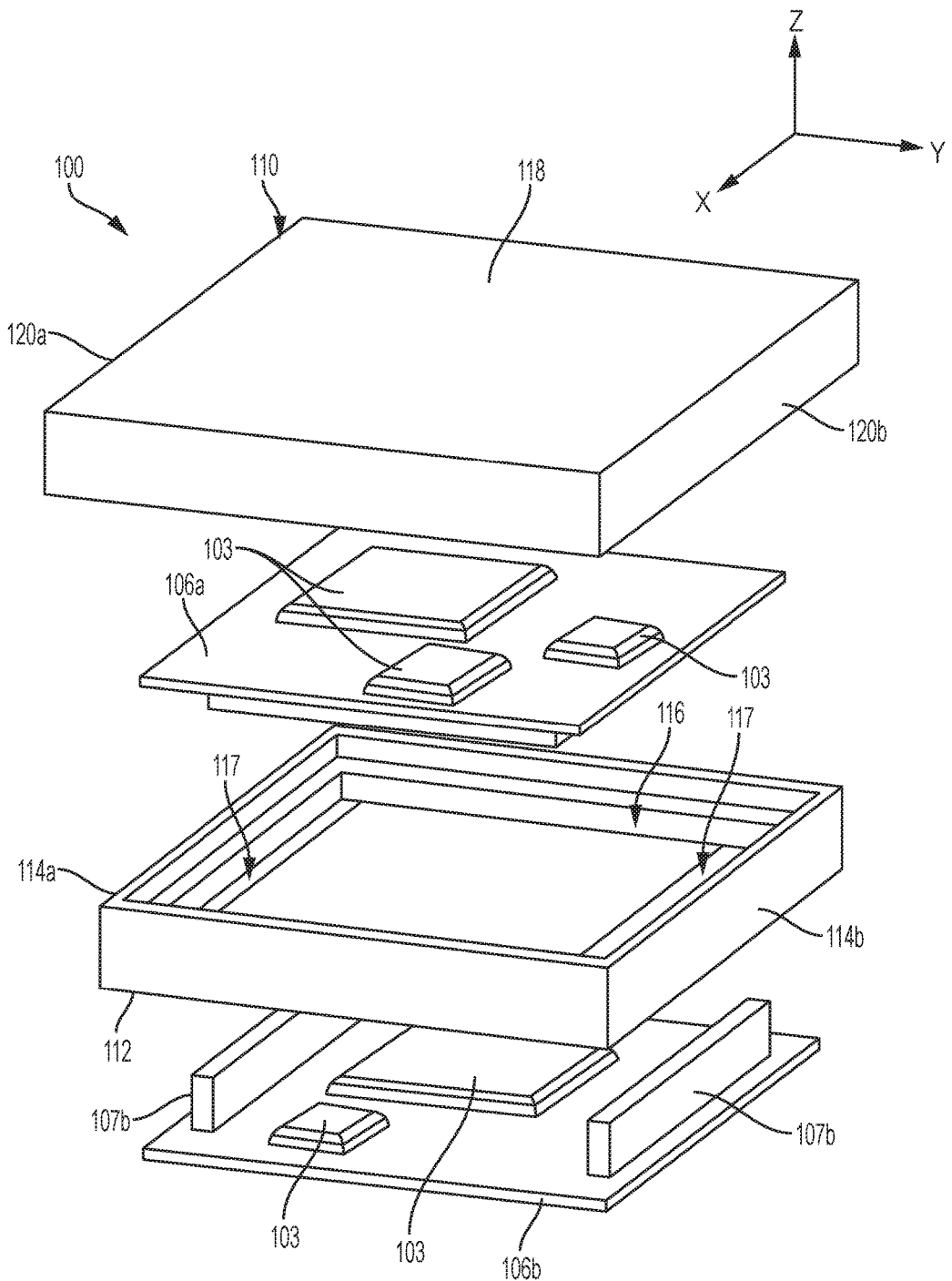
FIG. 2 is a disassembled perspective viewed from the top of a 3D microcircuit card assembly according to a non-limiting embodiment.
Figure 3:
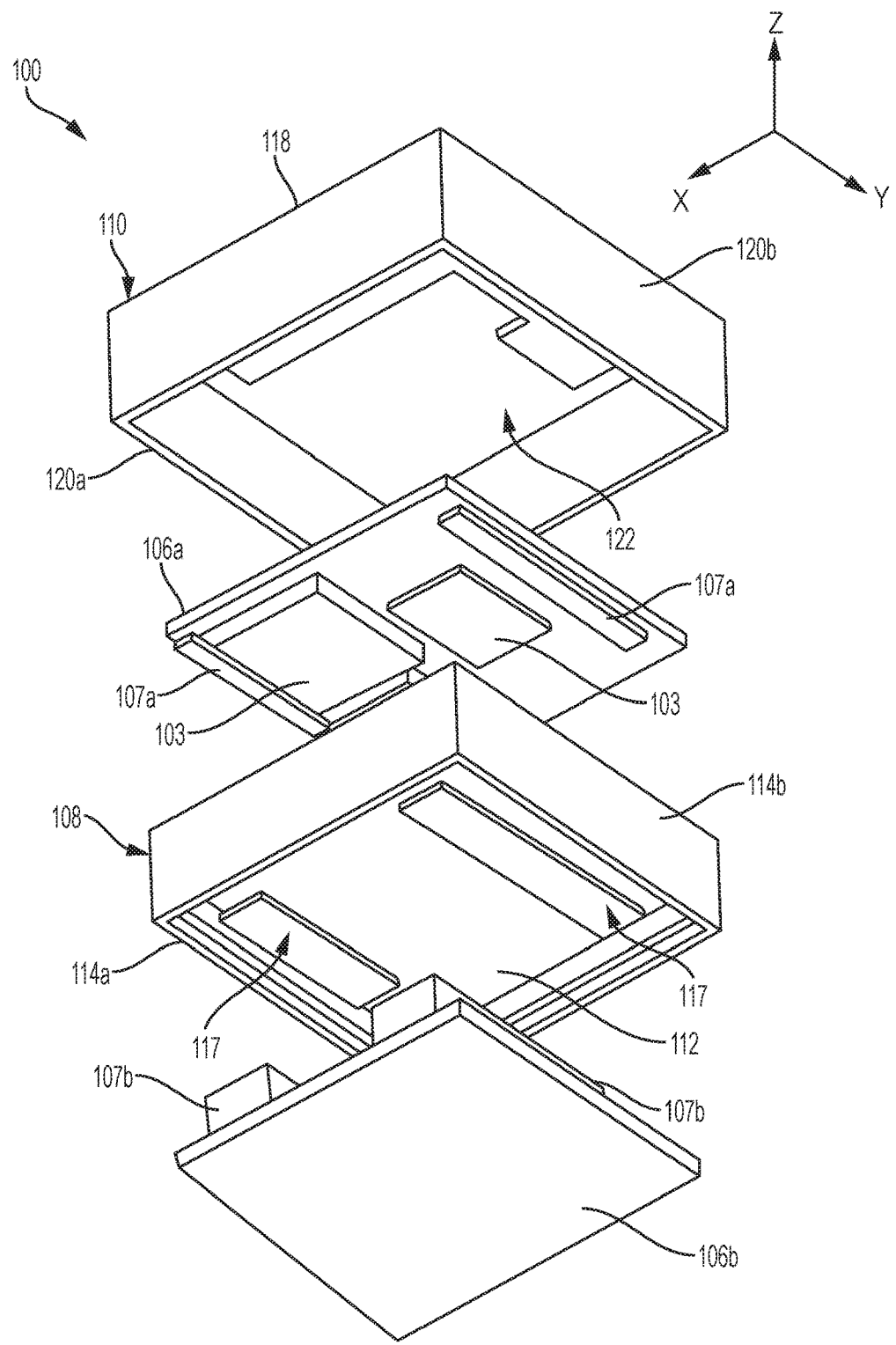
FIG. 3 is a disassembled perspective viewed from the bottom of a 3D microcircuit card assembly according to a non-limiting embodiment.

With reference now to FIGS. 1-3, a 3D microcircuit card assembly 100 including dual-sided passive cooling paths is illustrated according to a non-limiting embodiment. The 3D microcircuit card assembly 100 includes a substrate package 102 and a passive heat transfer unit 104. The substrate package 102 includes a plurality of individual substrates 106a and 106b stacked atop one another. Although two substrates 106a and 106b are illustrated, additional substrates can be included and stacked along with the first and second substrates 106a and 106b.

The substrates 106a and 106b can be formed, for example, as a high density interconnect (HDI) circuit board composed of an organic material, and can include one or more electrical components 103 such as, for example, circuit dies, packaged circuits, and other electronic parts. The length (e.g., along the Y-axis) of the first and second substrates 106a and 106b can range, for example, from approximately 65 millimeters (mm) to approximately 33 mm. The width (e.g., along the X-axis) of the first and second substrates 106a and 106b can range, for example, from approximately 65 mm to approximately 33 mm. The height (e.g., along the Z-axis) of the first and second substrates 106a and 106b can range, for example, from approximately 20 mm to approximately 10 mm >.

The electrical components 103 can be formed on a single surface (e.g., upper surface or lower surface) of the substrates 106a and 106b, or on multiple surfaces (e.g., the upper surface and lower surface) of the substrates 106a and 106b. In addition, the lower surface of the second substrate 106b can include one or more interconnects elements 109 such as solder bumps, for example, which allows the second substrate 106 to be connected to another level or another portion of a main motherboard.

The passive heat transfer unit 104 includes one or more intermediate heat dissipation plates 108 and a thermally conductive dissipation cover 110. The intermediate heat dissipation plate 108 is composed of an electrically conductive material such as metal, for example, and is interposed between the first substrate 106a and the second substrate 106b. In at least one embodiment, the heat dissipation plate 108 is separated from the plurality of individual substrates, but is still in thermal communication with the substrates 106a and 106b to receive heat therefrom (e.g., heat generated by operating electrical components). In this manner, the intermediate heat dissipation plates 108 receives (e.g., thermally absorbs) heat from the substrates 106a and 106b included in the substrate package 102. The thickness of the intermediate heat dissipation plate 108 can range, for example, from about 1 mm or greater. Although a single heat dissipation plate 108 is illustrated, additional heat dissipation plates can be employed such that each intermediate heat dissipation plate is interposed between a pair of stacked substrates included in the substrate package 102.

In at least one embodiment, the intermediate heat dissipation plate 108 includes a base 112, and plate sidewalls 114a and 114b that extend orthogonally (or approximately perpendicular) along a vertical axis (e.g., Z-axis) with respect to the base 112. In at least one embodiment, the base 112 and plate sidewalls 114a and 114b define a central cavity 116 (see FIG. 2). The base 112 can further include one or more slots 117 (see FIGS. 2 and 3) formed therethrough, which allow access to the first and second dissipation plates 106a and 106b. In this manner, a first interconnect 107a formed on the first substrate 106a can brought into connection with a second interconnect 107b formed on the second substrate 106b (see FIGS. 2 and 3).

The dissipation cover 110 is composed of a thermally conductive material such as metal, for example, and is configured to dissipate heat received from the intermediate heat dissipation plate 108 into the surrounding air and away from the 3D circuit card assembly 100. In at least one embodiment, the dissipation cover 110 is separated from the intermediate heat dissipation plates 108, but is still in thermal communication with the intermediate heat dissipation plates 108 so to receive heat therefrom. The upper surface thickness of the dissipation cover 110 can range, for example, from about 1 mm or greater. In at least one embodiment, the dissipation cover 110 includes an upper surface 118, and cover sidewalls 120a and 120b that extend orthogonally (or approximately perpendicular) along a vertical axis (e.g., Z-axis) with respect to the upper surface 118. In at least one embodiment, the upper surface 118 and the cover sidewalls 120a and 120b define an inner cavity 122 (see FIG. 3) that surrounds the substrates 106a and 106b included in the substrate package 102, along with the intermediate heat dissipation plate 108.

The dissipation cover 110 and the intermediate heat dissipation plate 108 are arranged such that cover sidewalls 120a and 120b are in thermal communication with the plate sidewalls 114a and 114b. In at least one embodiment, the cover sidewalls 120a and 120b are thermally coupled to the plate sidewalls 114a and 114b via a thermally conductive adhesive layer (not shown in FIGS. 1-3). That is, the cover sidewalls 120a and 120b and the plate sidewalls 114a and 114b can directly contact a thermally conductive adhesive interposed therebetween. The thermally conductive adhesive layer can be composed of various thermally conductive materials including, but not limited to, Room-Temperature-Vulcanizing (RTV) silicone (Si).

Figure 4:
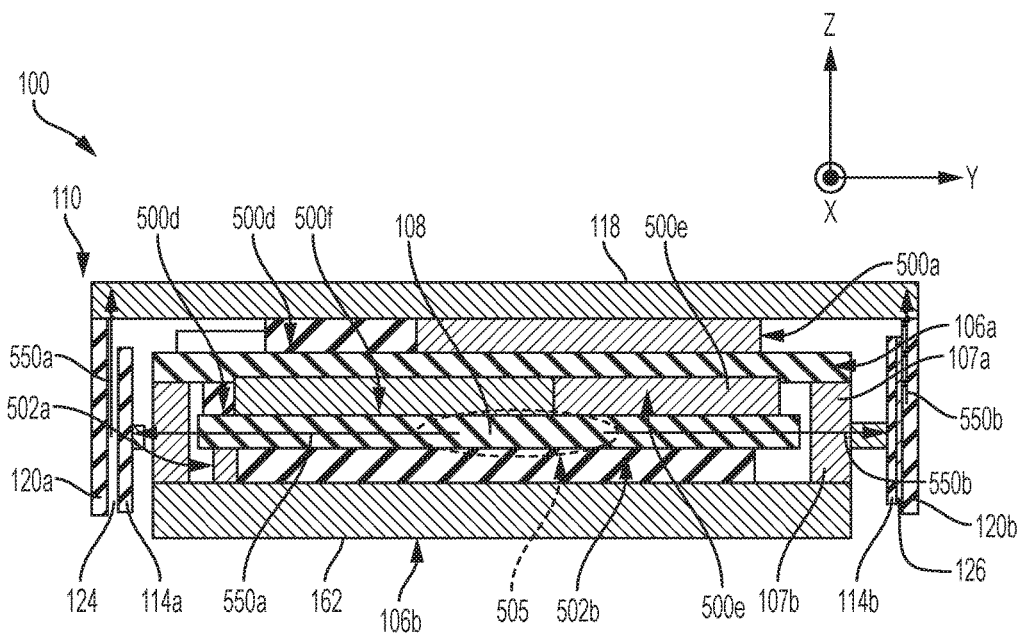
FIG. 4 is a cross-sectional view of the 3D microcircuit card assembly taken along line A-A according to a non-limiting embodiment.
Figure 5A:
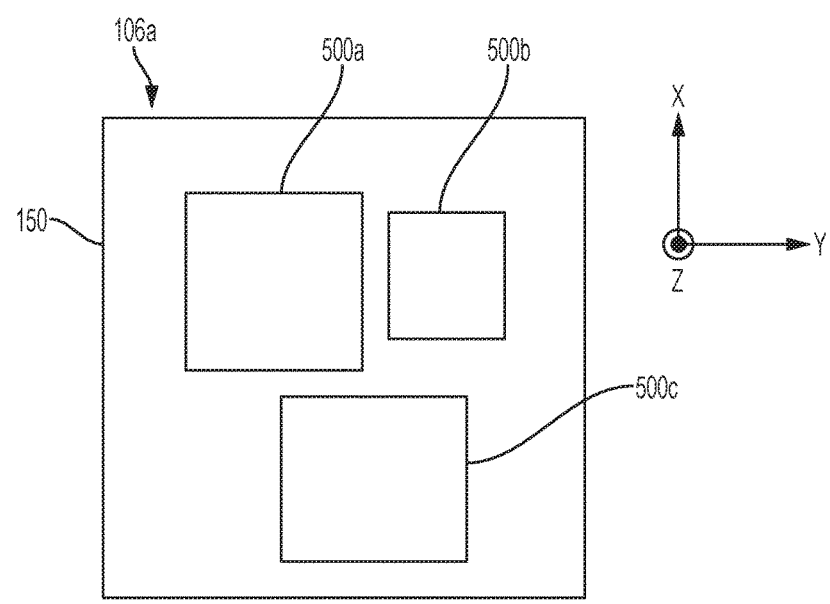
FIG. 5A is a top view of an upper surface of a first substrate included in a 3D microcircuit card assembly illustrated in FIG. 4 according to a non-limiting embodiment.
Figure 5B:
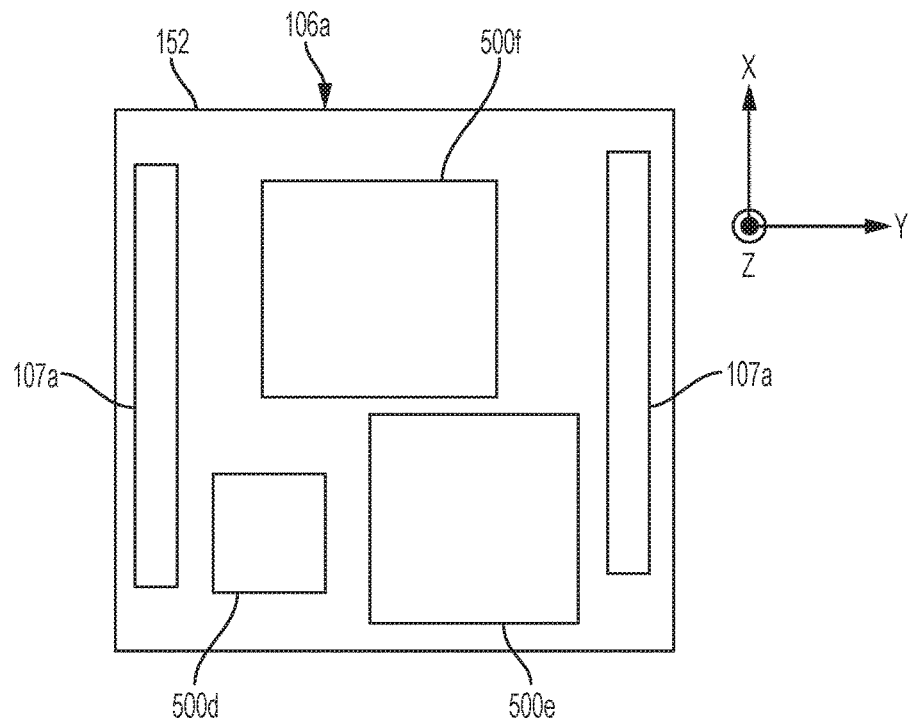
FIG. 5B is a top view of a lower surface of the first substrate shown in FIG. 5A according to a non-limiting embodiment.

With reference to FIG. 4, a cross-sectional view of the 3D microcircuit card 100 assembly taken along line A-A is illustrated according to a non-limiting embodiment. As described above, the 3D microcircuit card assembly achieves a 3D packaging design by vertically stacking (e.g., along the Z-axis) a first substrate 106a and a second 106b. The first substrate 106a (individually shown in FIGS. 5A and 5B) includes a first pair of opposing sides extending along a first axis (e.g., Y-axis) to define a first substrate length, and a second pair of opposing sides extending along a second axis (e.g., X-axis) perpendicular to the first axis (e.g., Y-axis) to define a first substrate width. The first and second sides extend along a third axis (e.g., Z-axis) and between a first upper substrate surface 150 and a first lower substrate surface 152 to define a first substrate height.

The first upper substrate surface 150 includes one or more first substrate electrical components 500a, 500b, and 500c formed thereon. The first lower substrate surface 152 also includes one or more first substrate electrical components 500d, 500e, and 500f formed thereon. It should be appreciated that the first substrate electrical components 500a-500f are not limited to the components illustrated in FIGS. 5A and 5B. The first lower substrate surface 152 also includes one or more first substrate interconnects 107a such as electrical ports, for example, configured to send/receive power signals and/or data signals.

The first substrate 106a is disposed in the central cavity (see FIG. 2) of the intermediate heat dissipation plate 108. Accordingly, the first lower substrate surface 152 of the first substrate 106a contacts the intermediate heat dissipation plate 108 (i.e., an upper surface of the base). In addition, the first substrate electrical components 500d, 500e, and 500f formed on the first lower substrate surface 152 can also directly contact the intermediate heat dissipation plate 108, while the first substrate interconnect 107a extends through the slot 117 (see FIGS. 2 and 3) formed in the intermediate heat dissipation plate 108.

Figure 5C:
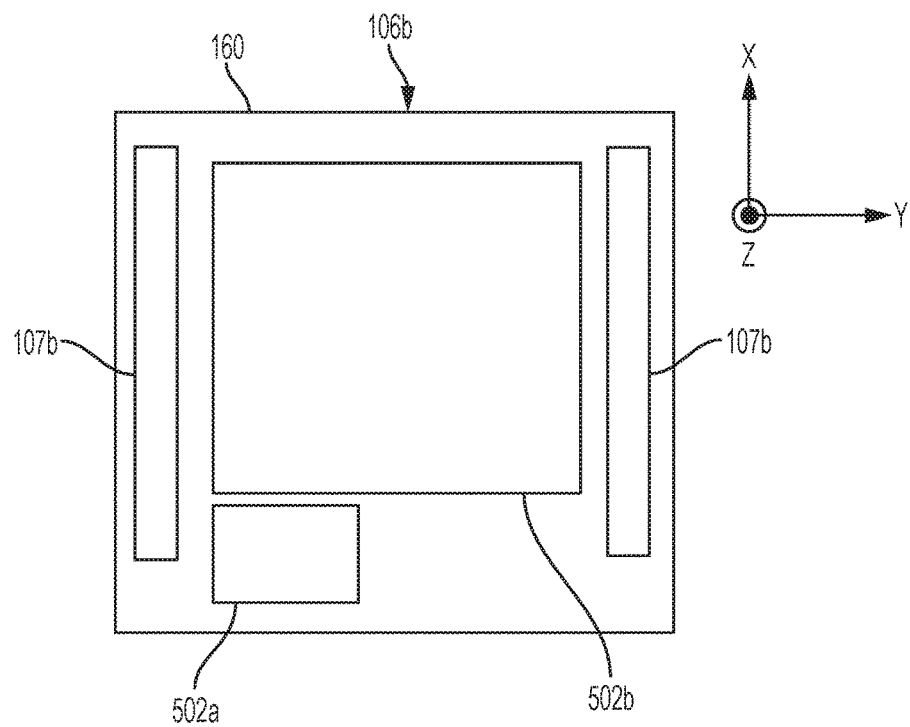
FIG. 5C is a top view of an upper surface of a second substrate included in the 3D microcircuit card assembly illustrated in FIG. 4 according to a non-limiting embodiment.

The second substrate 106b (individually shown in FIG. 5C) includes a first pair of opposing sides extending along the first axis (e.g., Y-axis) to define a second substrate length, and a second pair of opposing sides extending along the second axis (e.g., X-axis) to define a second substrate width. The first and second sides extend along the third axis (e.g., Z-axis) and between a second upper substrate surface 160 and a second lower substrate surface 162 (see FIG. 4) to define a second substrate height.

The second upper substrate surface 160 of the second substrate 106b includes one or more second substrate electrical components 502a and 502b formed thereon. It should be appreciated that the second substrate electrical components 502a and 502b are not limited to the components illustrated in FIG. 5C. The second upper substrate surface 160 also includes one or more second substrate interconnects 107b such as electrical pins, for example, configured to send/receive power signals and/or data signals.

The second upper substrate surface 160 of the second substrate 106b directly contacts the intermediate heat dissipation plate 108 (i.e., a lower surface of the base). In addition, the second substrate electrical components 502a and 502b formed on the second upper substrate surface 160 can also directly contact the intermediate heat dissipation plate 108 (i.e., a lower surface of the base), while the second substrate interconnect 107b extends through the slot 117 and connects to the first substrate interconnect 107a formed on the first lower substrate surface 152 of the first substrate 106a. The interconnection allows the first substrate 106a and/or the second substrate 106b to be disconnected from one another, and replaced with a different substrate at any time. In other words, the first substrate 106a and the second substrate 106b can be electrically connected to one another independent from the thermal path between the electrical components and the components' neighboring heatspreader surface.

The dissipation cover 110 is arranged over the stacked alternating arrangement of the first substrate 106a, the intermediate heat dissipation plate 108, and the second substrate 106b. Accordingly, the dissipation cover 110 can serve to protect the underlying stack of substrates 106a and 106b, along with their corresponding electrical substrate components 500a-5002e and 502a-502b from physical damage. In at least one embodiment, the inner surface of the cover sidewalls 120a and 120b are capable of sliding over the outer surface of the plate sidewalls 114a and 114b until making direct contact with the first substrate electrical components 500a-500c and/or the first upper substrate surface 150 of the first substrate 106a. Accordingly, the cover sidewalls 120a and 120b can be disposed directly against the plate sidewalls 114a and 114b, respectively.

In at least one embodiment, a small air gap 124 ranging from about 10 millimeters (mm) to about 15 mm, for example, may be present between a cover sidewall (e.g., 120a) and a plate sidewall (e.g., 114b). This gap 124 can be omitted by interposing a thermally conductive adhesive layer 126 between the plate sidewall (e.g., 114b) and the cover sidewall (120b). Accordingly, the plate sidewall 114a and the cover sidewall 120a both directly contact the thermally conductive adhesive layer 126. The thermally conductive adhesive layer 126 can be composed of various thermally conductive materials including, but not limited to, RTV Si. In either case, it can be understood that the cover sidewalls 120a and 120b and the plate sidewalls 114a and 114b are thermally coupled to one another, i.e., in thermal communication with one another, because the cover sidewalls 120a and 120b and the plate sidewalls 114a and 114b are composed of a thermally conductive material. The path from the intermediate heat dissipation plate 108 to a respective cover sidewall 120a and 120b defines an individual passive cooling path (indicated as arrows 550a and 550b).

During operation, the dual-sided passive cooling paths 505a and 505b effectively remove heat from the 3D stacked substrate package, including a central region 505, without relying on active cooling components (e.g., fans, powered fluid-based heat exchangers, etc.). For example, the intermediate heat dissipation plate 108 receives (e.g. absorbs) heat from the first and substrates 106a and 106b and their corresponding electrical components, along with heat present at the central region 505 of the assembly 102. The received heat is spread along the base of the intermediate heat dissipation plate 108, and is delivered to the first and second plate sidewalls 114a and 114b. In turn, the plate sidewalls 114a and 114b transfer the heat to the cover sidewalls 120a and 120b. Not only can the heat be dissipated by the cover sidewalls 120a and 120b, but can also be transferred to the larger surface area of the dissipating cover's upper surface 118 and effectively dissipated into the surrounding air and away from the 3D microcircuit card assembly 100.

Figure 6:
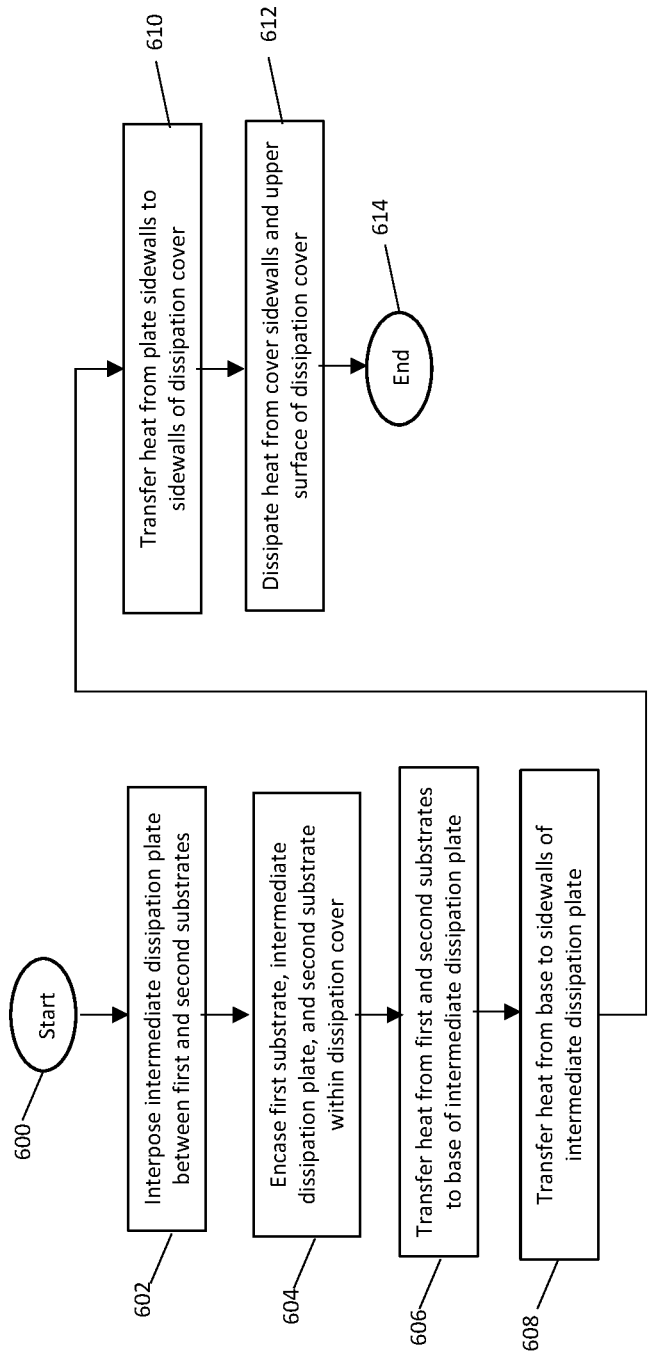
FIG. 6 is a flow diagram illustrating a method of dissipating heat from a 3D circuit card assembly according to a non-limiting embodiment.

Turning now to FIG. 6, a flow diagram illustrates a method of dissipating heat from a 3D circuit card assembly. The method begins at operation 600, and at operation 602 at least one intermediate heat dissipation plate is interposed between first and second substrate. In at least one embodiment, the intermediate heat dissipation plate directly contacts both the first and second substrates. At operation 604, the first substrate, the intermediate dissipation plate, and the second substrate are collectively encased in a thermally conductive dissipation cover. In this manner, opposing cover sidewalls of the dissipation cover are arranged in thermal communication with opposing plate sidewalls of the intermediate dissipation plate. At operation 606, heat from the first and second substrates are transferred to a base of the intermediate dissipation plate. At operation 608, heat received at the base is transferred to the opposing plate sidewalls. At operation 610, the heat is transferred from the opposing plate sidewalls to the opposing cover sidewalls. At operation 612, the heat received from the opposing plate sidewalls is dissipated away from the 3D circuit card assembly via the opposing cover sidewalls and an upper surface of the thermally conductive dissipation cover, and the method ends at operation 614.

As described above, various non-limiting embodiments provide a 3D microcircuit card assembly that includes dual-sided passive cooling paths. The 3D microcircuit card assembly includes an alternating stack of circuit substrates and one or more intermediate heat dissipation plates. The stacked arrangement is then encased in a thermally conductive dissipation cover. The intermediate heat dissipation plates transfer heat from the circuit substrate, including heat located at a central location of the stack, to opposing sidewalls of the dissipation cover along dual-sided cooling paths established in the 3D microcircuit card assembly. The sidewalls and the upper surface of the dissipation cover are configured to dissipate heat delivered thereto into the surrounding atmosphere and away from the assembly. In this manner, generated by a 3D stack of circuit substrates can be effectively passively dissipated without requiring additional active cooling components.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A three-dimensional (3D) circuit card assembly:
   a substrate package including a plurality of individual substrates stacked atop one another; and
   a passive heat transfer unit including at least one intermediate heat dissipation plate configured to receive heat from the substrate package, and a thermally conductive dissipation cover configured to dissipate the heat received from the at least one intermediate heat dissipation plate away from the 3D circuit card assembly,
   wherein the at least one intermediate heat dissipation plate includes a plurality of plate sidewalls connected together to define a central cavity and an inner cavity, a first substrate among the individual substrates disposed in the central cavity and a second substrate among the individual substrates different from the first substrate disposed in the inner cavity.

2. The 3D microcircuit card assembly of claim 1, wherein the at least one intermediate heat dissipation plate is interposed between at least one pair of stacked substrates included in the substrate package.

3. The 3D microcircuit card assembly of claim 2, wherein the thermally conductive dissipation cover includes an upper surface, and cover sidewalls extending orthogonally with respect to the upper surface, the upper surface and cover sidewalls defining an inner cavity that surrounds the substrate package and the at least one intermediate heat dissipation plate.

4. The 3D microcircuit card assembly of claim 3, wherein the at least one intermediate heat dissipation plate includes a base, and plate sidewalls extending orthogonally with respect to the base, the base configured to transfer the heat to the plate sidewalls.

5. The 3D microcircuit card assembly of claim 4, wherein the plate sidewalls are in thermal communication with the cover sidewalls.

6. The 3D microcircuit card assembly of claim 5, wherein the plate sidewalls are thermally coupled to the cover sidewalls via a thermally conductive adhesive layer.

7. The 3D microcircuit card assembly of claim 6, wherein the thermally conductive adhesive layer comprises a material selected from the group including Room-Temperature-Vulcanizing (RTV) silicone (Si).

8. The 3D microcircuit card assembly of claim 4, wherein the base and plate sidewalls define a central cavity, the base further including at least one slot formed completely therethrough.

9. The 3D microcircuit card assembly of claim 8, wherein the plurality of individual substrates comprises:
   a first substrate including a first upper substrate surface having at least one first electrical substrate component formed thereon, and a first lower substrate surface having at least one second electrical substrate component and at least one first substrate interconnect, each formed thereon; and
   a second substrate including a second upper substrate surface having at least one third electrical substrate component and at least one second substrate interconnect, each formed thereon.

10. The 3D microcircuit card assembly of claim 9, wherein the first substrate is disposed in the central cavity of the intermediate heat dissipation plate.

11. The 3D microcircuit card assembly of claim 10, wherein the first lower substrate surface directly contacts an upper surface of the base.

12. The 3D microcircuit card assembly of claim 11, wherein the at least one second electrical substrate component directly contacts the upper surface of the base, and the at least one first substrate interconnect is aligned with the at least one slot.

13. The 3D microcircuit card assembly of claim 12, wherein the second upper substrate surface of the second substrate is disposed against a lower surface of the base.

14. The 3D microcircuit card assembly of claim 13, wherein the at least one second substrate interconnect extends through the at least one slot and connects with the at least one first substrate interconnect formed on the lower surface of the first substrate, and wherein the at least one third electrical substrate component directly contacts the lower surface of the base.

15. A three-dimensional (3D) circuit card assembly:
   a substrate package including a plurality of individual substrates stacked atop one another, each substrate including an electrical component that omits heat during operation; and
   at least one intermediate heat dissipation plate separated from the plurality of individual substrates, the at least one intermediate heat dissipation plate in thermal communication with the plurality of individual substrates and configured to receive the heat from the plurality of individual substrates; and
   a thermally conductive dissipation cover configured to separate from the at least one intermediate heat dissipation plate, the thermally conductive dissipation cover in thermal communication with the at least one intermediate heat dissipation plate to remove the heat from the at least one intermediate heat dissipation plate and dissipate the heat from the 3D circuit card assembly.

16. The 3D microcircuit card assembly of claim 15, wherein the at least one intermediate heat dissipation plate is interposed between at least one pair of stacked substrates included in the substrate package.

17. The 3D microcircuit card assembly of claim 16, wherein the thermally conductive dissipation cover includes an upper surface, and cover sidewalls extending orthogonally with respect to the upper surface, the upper surface and cover sidewalls defining an inner cavity that surrounds the substrate package and the at least one intermediate heat dissipation plate.

* * * * *